United States Patent [19]
Kim et al.

[11] Patent Number: 5,392,232
[45] Date of Patent: Feb. 21, 1995

[54] SEMICONDUCTOR MEMORY DEVICE

[75] Inventors: Kyeong T. Kim; Ji H. Ahn, both of Seoul, Rep. of Korea

[73] Assignee: Samsung Electronics Co., Ltd., Kyungki, Rep. of Korea

[21] Appl. No.: 103,267

[22] Filed: Aug. 9, 1993

[30] Foreign Application Priority Data

Aug. 8, 1992 [KR] Rep. of Korea ............... 14243

[51] Int. Cl.⁶ ............................................. G11C 11/24
[52] U.S. Cl. ...................................... 365/51; 365/149
[58] Field of Search ............... 365/149, 51, 189.01, 365/182, 230.01

[56] References Cited

U.S. PATENT DOCUMENTS 5,136,533  8/1992  Harari ........................... 365/149

Primary Examiner—Terrell W. Fears
Attorney, Agent, or Firm—Robert A. Westerlund; Stephen R. Whitt; Charles R. Donohoe

[57] ABSTRACT

A semiconductor memory device including a memory cell array which is formed of each of memory cells connected to intersection of a plurality of bit lines and word lines is provided such that, during designing the layout, a length of a storage electrode of the outermost memory cell in the memory cell array is longer than that of a storage electrode of an inner memory cell, or a spacing between two bit lines in the periphery of the memory cell array is longer than that between bit lines in the inner portion of the memory cell array, or a width of an active region of the outermost memory cell is wider than that of an active region of the inner memory cell, thereby forming a metal layer having an excellent step coverage by means of only the layout arrangement without additional processes while being not concerned about the structure of a storage electrode.

6 Claims, 7 Drawing Sheets

SEMICONDUCTOR MEMORY DEVICE

BACKGROUND OF THE INVENTION

The present invention relates to a semiconductor memory device, and more particularly to a highly integrated dynamic random access memory (DRAM) device.

Along with a recent trend toward attaining further packing density in a semiconductor memory device, the height of a capacitor is increasingly heightened in a DRAM cell which is composed of a transistor and the capacitor in order to secure sufficient capacitance within a limited area. In other words, the heightening the height of the capacitor compensates for decrease of the capacitor area due to the high integration of the semiconductor memory device. This increase of the height of the capacitor unstabilizes step coverage, which is apt to cause disconnection during forming a metal layer. An interlayer insulating film formed under the metal layer can be thickened to improve the step coverage. However, thicker interlayer insulating film is liable to induce disconnection of the metal layer due to a deep contact hole during a contact process for allowing the metal layer to contact a predetermined impurity region in a semiconductor substrate. As described above, since the thickness of the interlayer insulating film and the interlayer connection characteristic are mutually related, thickening the thickness of the interlayer insulating film is improper. For the purpose of preventing the disconnection of the metal layer, a technique is suggested in Korean Patent Application No. 90-13003 (Korean Patent Publication No. 91-5462) entitled: "Dynamic Random Access Memory Device" filed by Nippon Electronics Co., Ltd., in which a sloped-sidewall structure is formed in the peripheral side from a lower electrode of a capacitor of a peripheral memory cell in a memory cell array.

FIG. 1 is a sectional view showing a semiconductor memory device manufactured by a conventional technique, which is described in the above patent application.

Here, only two peripheral memory cells in a memory cell array which is formed of each of memory cells connected to intersection of a plurality of bit lines and word lines are illustrated. In a semiconductor substrate 11 of a first conductivity type, first, second and third impurity regions 12a, 15 and 13a of a second conductivity type opposite to the first conductivity type are formed apart from each other by a predetermined distance. The first and third impurity regions 12a and 13a act as a storage node of the memory cell, and the second impurity region 15 is connected to a bit line. Gate electrodes 12c and 13c are formed over the substrate 11 between the impurity regions using gate insulating layers 12b and 13b as respective interlayers. The gate electrodes 12c and 13c form a switching transistor of the memory cell together with the impurity regions 12a, 15 and 13a. Lower electrodes 12d and 13d composed of a polycrystalline silicon contacted with the first and third impurity regions 12a and 13a via contact holes 16a and 16b formed by etching a predetermined portion of a first insulating layer 16 formed on the semiconductor substrate 11 is respectively formed. At this time, a sloped-sidewall structure 17 is formed on the first insulating layer 16 in the outermost portion of the memory cell array, which has a steep inner wall 17a toward the inside of the memory cell array, but has a gently sloped outer wall 17b toward the outside thereof. A peripheral circuit of the semiconductor memory device is formed in the outside of the outer wall 17b. An upper electrode 19 is formed over the lower electrodes 12d and 13d using a dielectric film 18 as an interlayer, thereby forming a capacitor. The switching transistor and capacitor form unit memory cell of the memory cell array. Then, a second insulating layer 20 and a metal layer 21 are formed over the substrate 11, thereby forming the memory cell array.

As illustrated in FIG. 1, by forming the sloped-sidewall structure, the metal layer having an excellent step coverage is formed even though the thickness of the lower electrode and the insulating layer thereon is thickened.

However, an additional photolithography and an etching for forming the slope of the outer wall are needed to form the sloped-sidewall structure. Moreover, since a polycrystalline silicon layer used for forming the sloped-sidewall should be left in the periphery of the memory cell array during forming the lower electrode of the capacitor to form the sloped-sidewall structure, the technique is adopted to only a DRAM cell having a single stack-type capacitor structure. That is, in a DRAM cell having a cylindrical or fin-type capacitor structure, the polycrystalline silicon layer left in the periphery of the memory cell array also has the cylindrical or fin-type shape, thereby impeding the formation of the sloped-sidewall structure. Accordingly, the sloped-sidewall structure is adoptable to only the single stack-type capacitor structure.

SUMMARY OF THE INVENTION

Therefore, it is an object of the present invention to provide a semiconductor memory device having a metal layer not being disconnected regardless of increased steps due to the high integration of the semiconductor memory device.

It is another object of the present invention to provide a semiconductor memory device having a metal layer having an excellent step coverage without additional processes.

It is further another object of the present invention to provide a semiconductor memory device having a metal layer having an excellent step coverage regardless of the structure of a storage electrode of a DRAM cell.

It is still another object of the present invention to provide a semiconductor memory device having a metal layer having an excellent step coverage without additional processes while being not concerned about the structure of a storage electrode of a DRAM cell.

It is yet another object of the present invention to provide a semiconductor memory device having a metal layer having an excellent step coverage without additional processes while being not concerned about a storage electrode structure and the height of steps of a DRAM cell.

To achieve the objects of the present invention, there is provided a semiconductor memory device including a memory cell array formed of each of memory cells connected to intersection of a plurality of bit lines and word lines, wherein a storage electrode of an outermost memory cell in the memory cell array is sloped toward a periphery of the memory cell array to form a predetermined inclination angle with respect to the surface of a semiconductor substrate, and a length of the storage electrode of the outermost memory cell is longer than that of a storage electrode of an inner memory cell in the memory cell array, and a width of an active region of the outermost memory cell is wider than that of an active region of the inner memory cell in the memory cell array, and a spacing between two bit lines in the periphery of the memory cell array is wider than that between two bit lines in an inner portion of the memory cell array, and the bit line in the periphery of the memory cell array is disposed in an outer portion of the active region of the outermost memory cell, and a height of the storage electrode of the outermost memory cell is lower than that of the storage electrode of the inner memory cell in the memory cell array.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Figure 1:
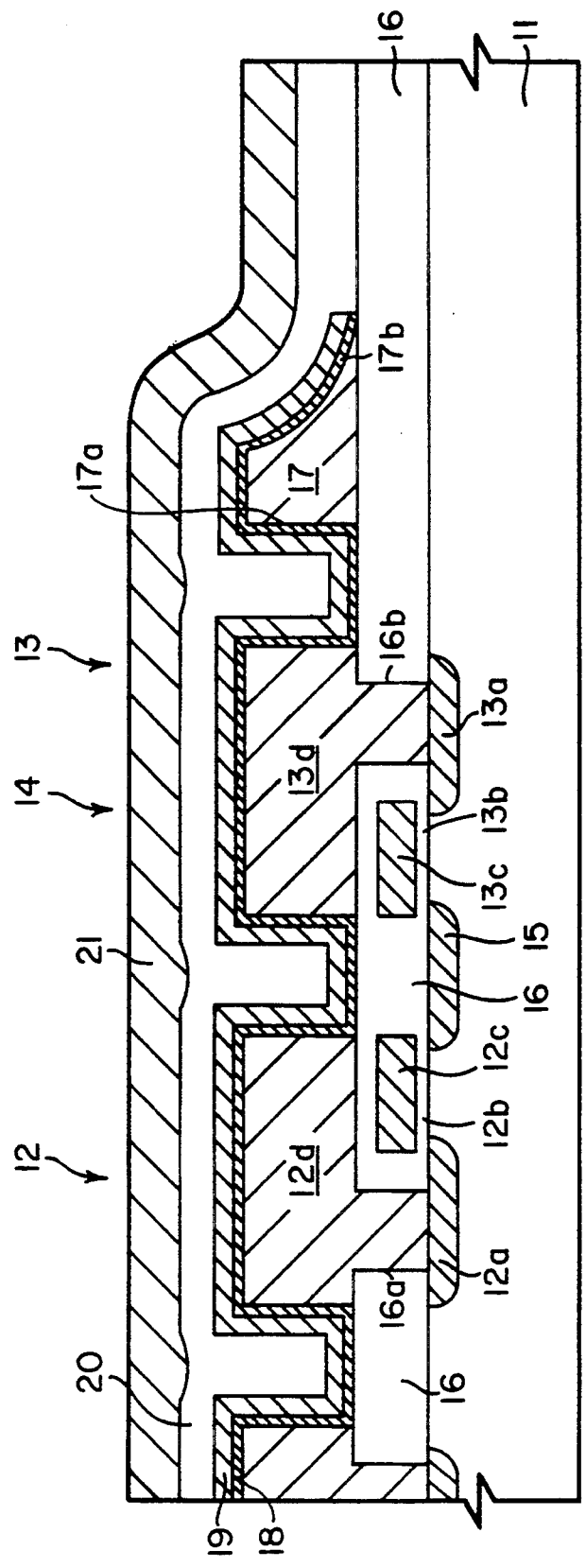
FIG. 1 is a sectional view showing a semiconductor memory device manufactured by a conventional technique.

Hereinafter, the same reference numerals represent the same elements.

Figure 2:
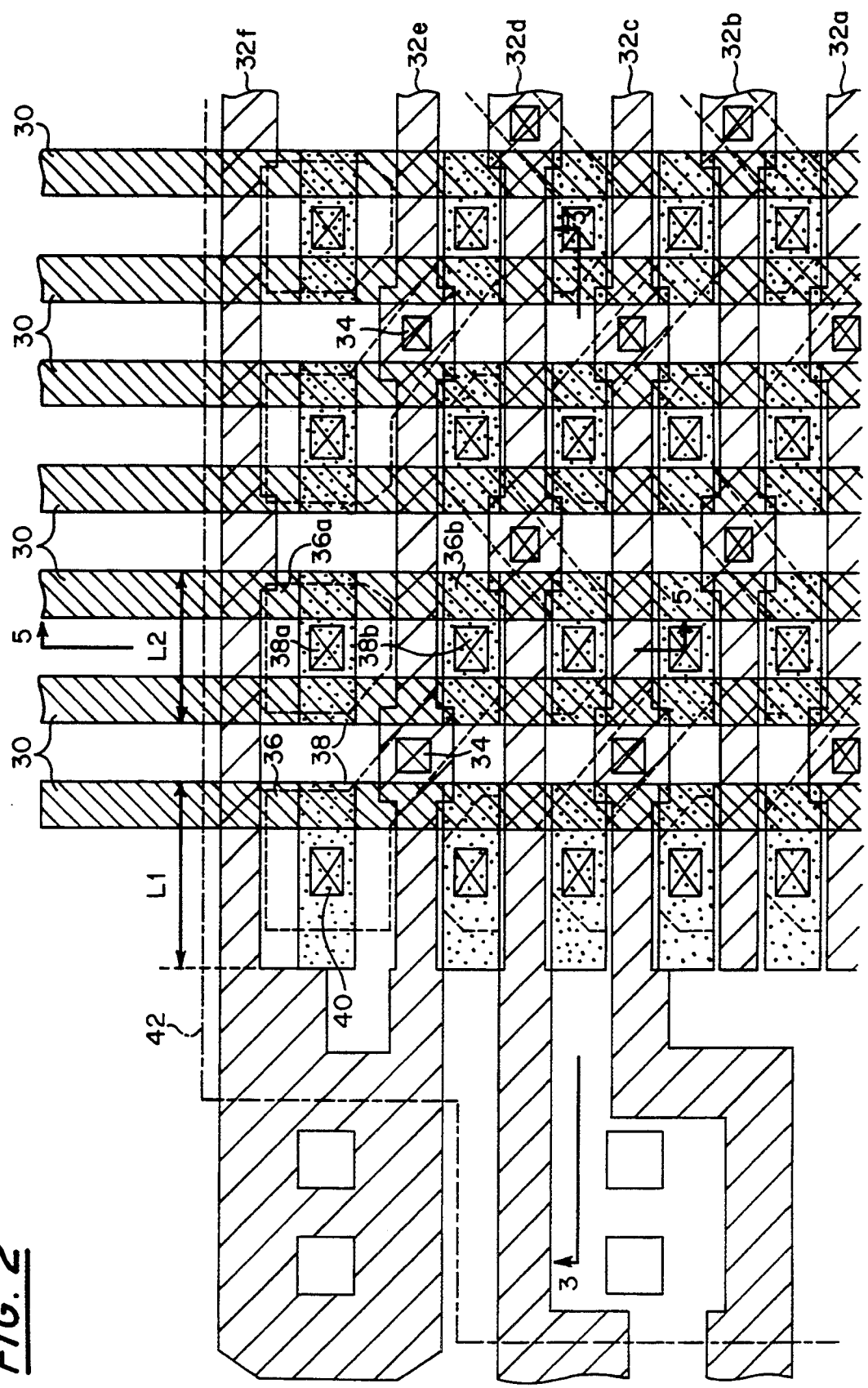
FIG. 2 is a layout of a semiconductor memory device according to the present invention.

FIG. 2 is a layout of a semiconductor memory device according to the present invention, which illustrates a peripheral region including an outermost memory cell in a memory cell array. A stack-type DRAM cell having a buried bit line is given as an example in preferred embodiments of the present invention.

Here, word fines 30 longitudinally extend, and bit lines 32a~32f laterally extend to intersect the word lines 30. Active regions 36 arranged in predetermined portions under the word fines 30 form switching transistors, using the word lines 30 as gate electrodes, respectively. Storage electrodes 38 formed across adjacent word lines form stack capacitors together with a plate electrode 42 covering over the upper portion of them. The bit lines 32a~32f contact with the active regions 36 by means of first contact regions 34, and the storage electrodes 38 contact with the active regions 36 by means of second contact regions 40, respectively. In this layout, a length $L_1$ of a storage electrode of an outermost memory cell in the bit line direction is longer than that $L_2$ of a storage electrode of an inner memory cell in the memory cell array. Also, a width of an active region 36a of the outermost memory cell in the memory cell array is wider than that of an active region 36b of the inner memory cell.

Figure 3:
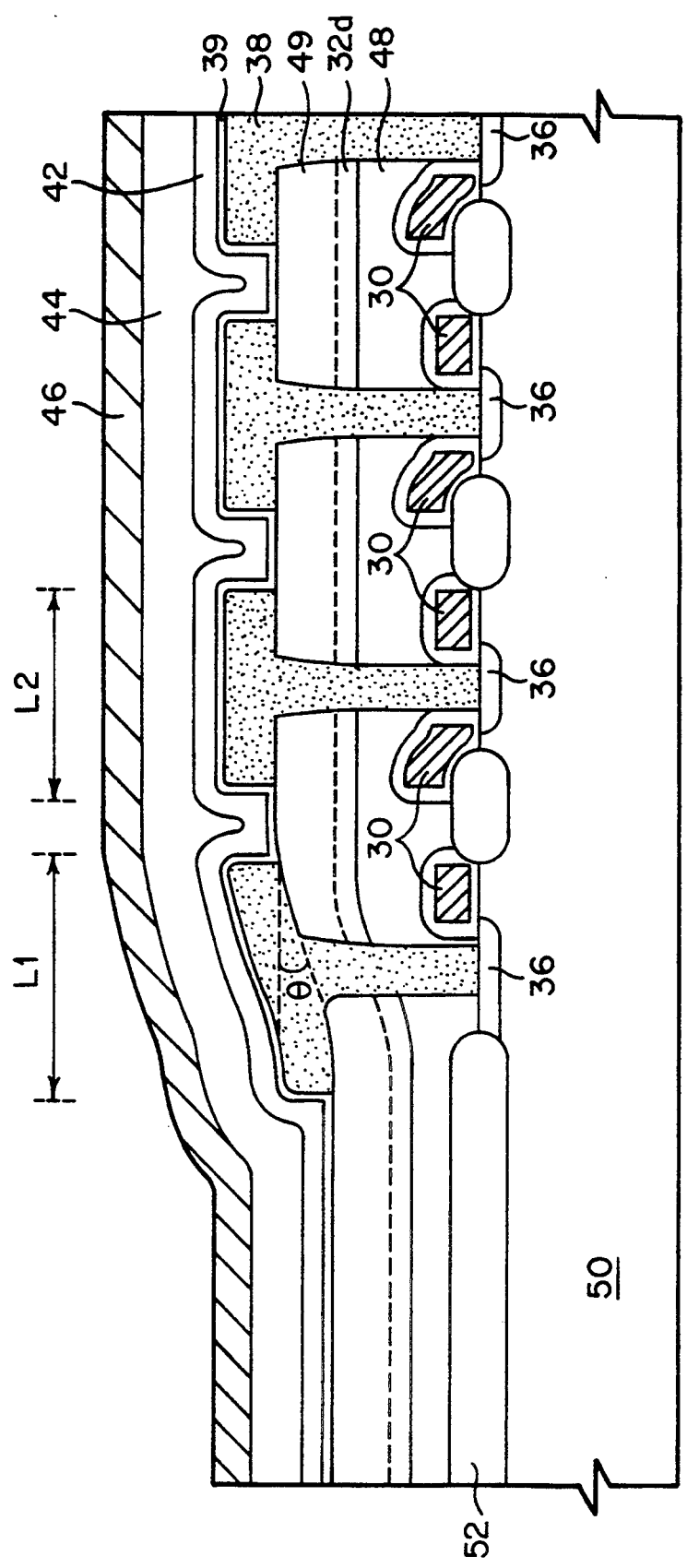
FIG. 3 is a sectional view showing a semiconductor memory device according to a first embodiment of the present invention.

FIG. 3 is a sectional view showing a first embodiment of the semiconductor memory device, taken along line A—A' of FIG. 2.

Here, the word line 30 used as a gate electrode of the switching transistor is formed over a predetermined portion of a semiconductor substrate 50 of a first conductivity type having a field oxide layer 52 formed thereon. Using an insulating layer formed on the upper surface and in the side of the word line 30 as a mask for ion-implantation, the active region 36 formed by ion-implanting an impurity of a second conductivity type contacts with the storage electrode 38 which is a lower electrode of a capacitor. The storage electrode 38 of the outermost memory cell in the memory cell array is sloped toward the periphery of the memory cell array to form a predetermined inclination angle $\theta$ with respect to the surface of the semiconductor substrate 50. Therefore, a metal layer 46 formed in a succeeding processing is easily formed.

The storage electrodes 38 are electrically insulated with one another by means of first and second interlayer insulating films 48 and 49. The plate electrode 42 utilized as an upper electrode of the capacitor is formed over the semiconductor substrate 50 having the storage electrode 38 formed thereon, using a dielectric film 39 as an interlayer. A third interlayer insulating film 44 and the metal layer 46 are stacked, thereby forming the memory cell array. Here, because the length $L_1$ of the outermost storage electrode 38 in the memory cell array is longer than that $L_2$ of the inner storage electrode 38 in the memory cell array, the metal layer 46 formed over the upper portion thereof can easily extend. As one method for making the length $L_1$ of the outermost storage electrode longer than that $L_2$ of the inner storage electrode, a length of a photomask pattern for forming the outermost storage electrode is formed to be longer than that for forming the inner storage electrode.

Figure 4A:
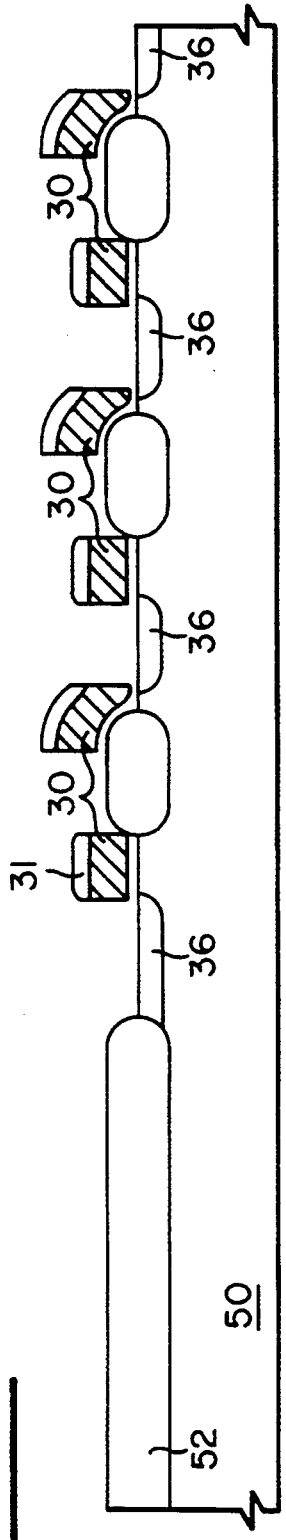
FIGS. 4A to 4D are sectional views showing steps of manufacturing the semiconductor memory device shown in FIG. 3.

FIGS. 4A to 4D are sectional views showing steps of manufacturing the semiconductor memory device shown in FIG. 3. In FIG. 4A, the field oxide layer 52 for isolating elements is formed on the semiconductor substrate 50 of the first conductivity type by a selective oxidation method, and the word line 30 being apart from the surface of the semiconductor substrate 50 by means of a gate oxide layer formed on the surface of the semiconductor substrate 50 and having a first insulating layer 31 to be formed thereon is formed over a predetermined portion of the semiconductor substrate 50 between the field oxide layers 52. Using the first insulating layer 31 formed on the upper surface of the word line 30 as a mask for ion-implantation, an impurity of the second conductivity type is ion-implanted to form the active region 36. The word line 30 is utilized as the gate electrode of the switching transistor forming the memory cell.

Figure 4B:
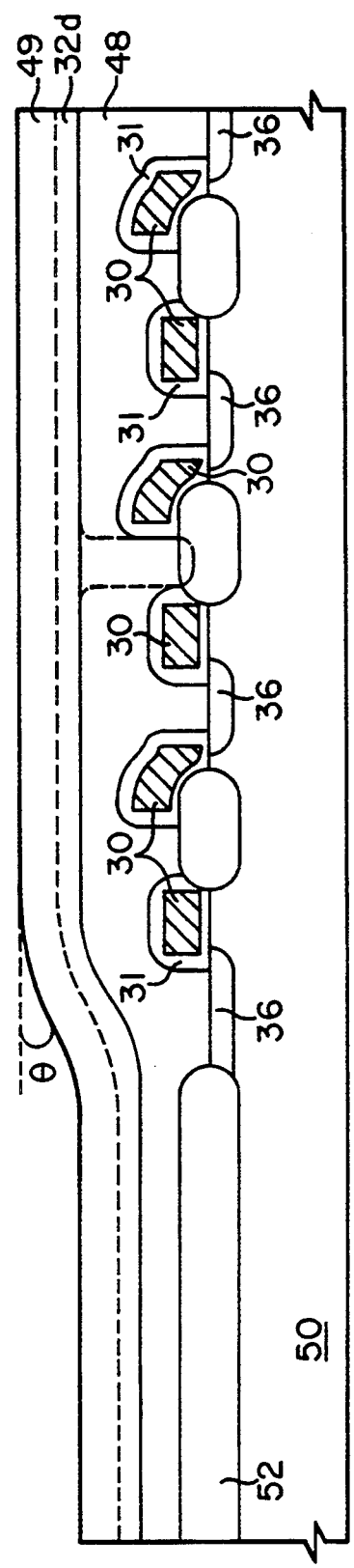

In FIG. 4B, after the first insulating layer 31 is formed in the sidewall of the word line 30, a borophosphorous silicate glass (BPSG) layer is thickly formed as the first interlayer insulating film 48 and a reflow process is carried out. Then, by etching a predetermined portion of the first interlayer insulating film 48, a contact hole is formed to contact the bit line 32d with the active region 36. After forming the bit line 32d intersecting the word line 30, a BPSG layer is thickly formed as the second interlayer insulating film 49 covering the upper and side portions of the bit line 32d, and a reflow process is carried out. Since the bit line 32d is formed in the front or rear portion of the sectioned plane parallel to the sectioned plane of FIG. 4B, it is not shown in the drawing but is denoted by a dotted line. Due to the steps between the upper surface of the field oxide layer 52 formed in the periphery of the memory cell array and the adjacent word line 30, the BPSG layer used as the first interlayer insulating film 48 slopes from the word line 30 side toward the field oxide layer 52 formed in the periphery of the memory cell array, so that the reflowed BPSG layer has a predetermined inclination angle $\theta$ with respect to the surface of the semiconductor substrate 50. The formation of the predetermined inclination angle $\theta$ is to improve the step coverage during a succeeding processing of forming the metal layer. Thus, the smaller predetermined inclination angle $\theta$ betters the step coverage during extending the metal layer. The predetermined inclination angle $\theta$ which is adjusted by the thickness of the BPSG layer, temperature for the reflow process and the position of a chip on a wafer, is $10° \sim 20°$ when the BPSG layer has a thickness of $3,000 \sim 5,000 Å$ and the reflow is performed at a temperature of $800° \sim 900°$ C. in a common processing. In the same method for forming the first interlayer insulating film 48, the BPSG layer used as the second interlayer insulating film 49 formed on the upper portion of the bit line 32d is preferably formed by having a thickness of $3,000 \sim 4,000 Å$ and performing the reflow process at a temperature of $800° \sim 900°$ C.

Figure 4C:
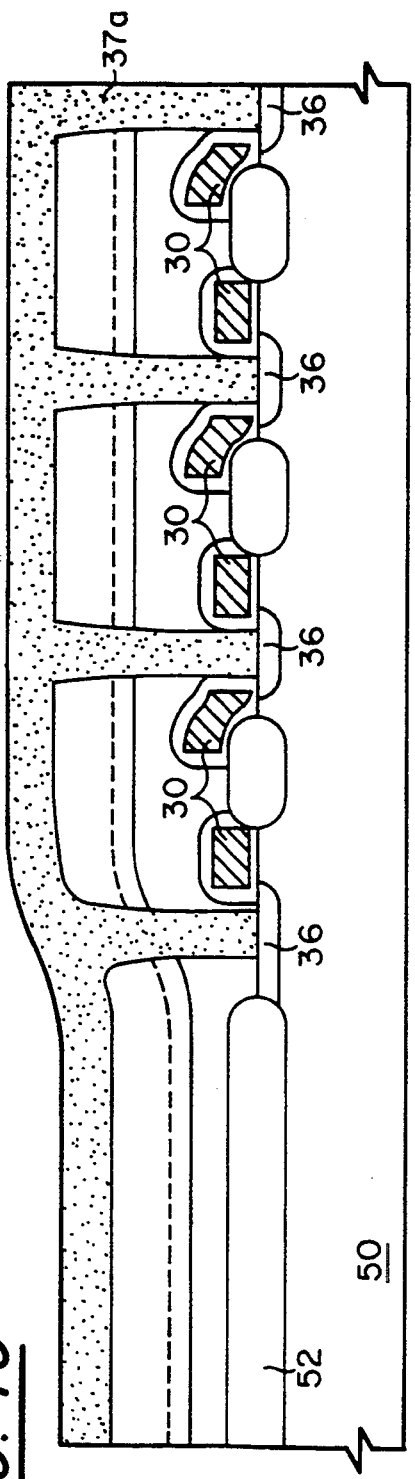

In FIG. 4C, a predetermined portion of the first and second interlayer insulating film 48 and 49 is etched to expose the surface of the active region 36 other than the active region 36 contacted with the bit line 32d, thereby forming a contact hole, and then a polycrystalline silicon layer 37a is formed over the semiconductor substrate 50. The polycrystalline silicon layer 37a is utilized for forming the storage electrode of the capacitor, and is doped with an impurity in a high concentration (e.g., $10^{19} ion/cm^3$), to increase conductivity thereof.

Figure 4D:
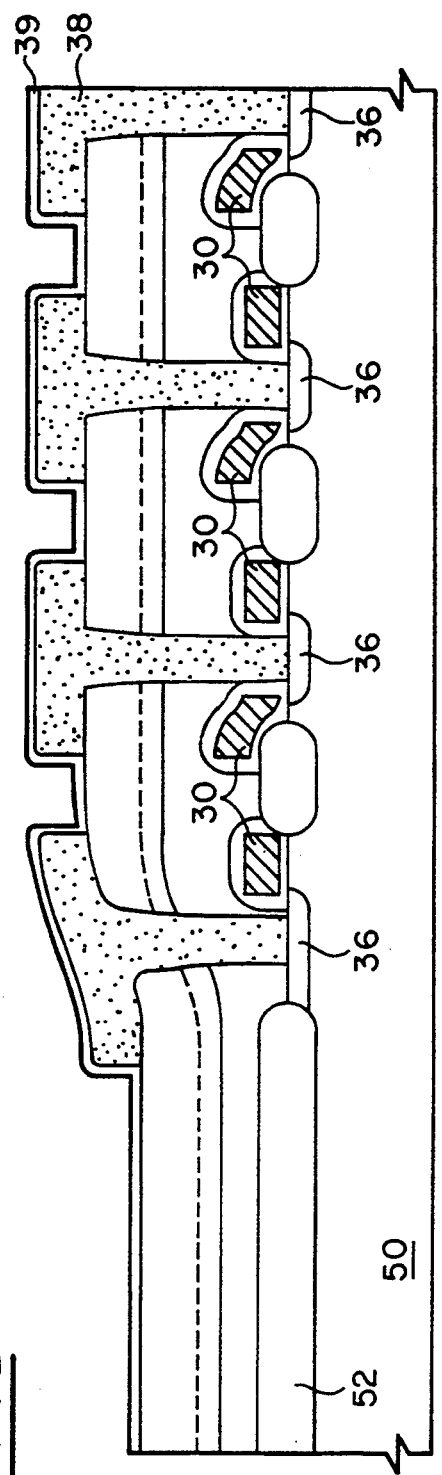

In FIG. 4D, using a photomask pattern, the polycrystalline silicon layer 37a is etched to expose predetermined portions of the surface of the second interlayer insulating film 49, thereby forming the storage electrode 38, and then the dielectric film 39 is formed over the semiconductor substrate 50. At this time, the length of the outermost storage electrode in the memory cell array is longer than that of the inner storage electrode in the memory cell array to improve the step coverage. In order to allow the length of the outermost storage electrode to be longer than that of the inner storage electrode, the length of the photomask pattern for forming the outermost storage electrode may be lengthened during forming the photomask pattern. After completing the steps shown in FIG. 4D, when the plate electrode 42, third interlayer insulating film 44 and metal layer 46 are sequentially formed on the dielectric film 39, the memory cell array shown in FIG. 3 is obtained.

Consequently, in the first embodiment according to the present invention shown in FIG. 3, the outermost storage electrode placed on the periphery of the memory cell array is formed to have a predetermined inclination angle with respect to the semiconductor substrate, so that the step coverage is improved during the succeeding processing of extending the metal layer.

Furthermore, while allowing the outermost storage electrode to have a predetermined inclination angle with respect to the semiconductor substrate, the length of the outermost storage electrode is longer than that of the inner storage electrode to improve the step coverage during the succeeding processing of extending the metal layer.

Figure 5:
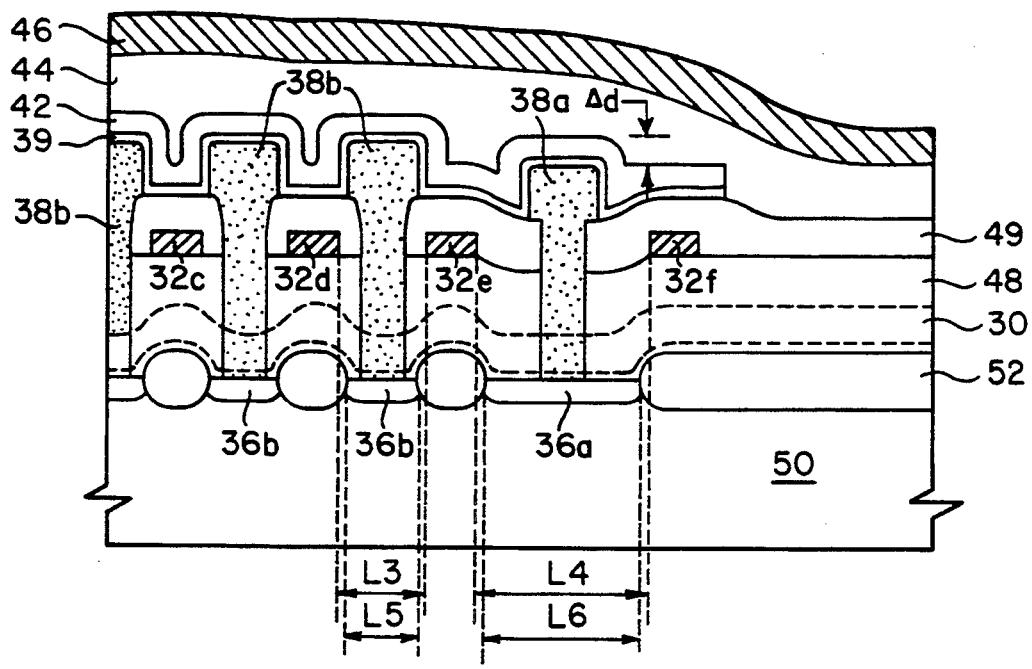
FIG. 5 is a sectional view showing a semiconductor memory device according to a second embodiment of the present invention.

FIG. 5 is a sectional view showing a second embodiment of the present invention taken along line B—B' in FIG. 2. Here, on a semiconductor substrate 50 of a first conductivity type having active regions 36a and 36b electrically apart from each other by a field oxide layer 52, storage electrodes 38a and 38b are formed in contact with the active regions 36a and 36b, respectively. Respective bit lines $32c \sim 32f$ covered with a second interlayer insulating film 49 between the storage electrodes are formed on the upper surface of a first interlayer insulating film 48 formed over the field oxide layer 52. A dielectric film 39, a plate electrode 42, a third interlayer insulating film 44 and a metal layer 46 are formed over the semiconductor substrate 50, thereby forming a memory cell array. Since a word line 30 is formed in the front or rear portion of the sectioned plane parallel to the sectioned plane of FIG. 5, it is not shown in the drawing but is denoted by a dotted line. A spacing $L_4$ between bit lines 32e and 32f in the periphery of the memory cell array is wider than that $L_3$ between bit lines 32d and 32e in the inner portion of the memory cell array. A width $L_6$ of the active region 36a of the outermost memory cell in the memory cell array is wider than that $L_5$ of the active region 36b of the inner memory cell in the memory cell array. The first interlayer insulating film 48 is formed as a BPSG layer, and planarized by a reflow process. At this time, the surface of the first interlayer insulating film 48 over the active region 36a of the outermost memory cell in the memory cell array is planarized to be lower than that of the first interlayer insulating film 48 over the active region 36b of the inner memory cell in the memory cell array, owing to the step of the word line 30 formed in the lower region thereof. Accordingly, if the second interlayer insulating film 49 is formed after forming the bit lines $32c \sim 32f$, and then the storage electrodes 38a and 38b contacted with the active regions 36a and 36b are formed as a polycrystalline silicon after the reflow process, height of the storage electrode 38a over the active region 36a of the outermost memory cell in the memory cell array and that of the storage electrode 38b over the active region 36b of the inner memory cell in the memory cell array have a difference as much as $\Delta d$. Due to this difference $\Delta d$, the metal layer 46 has a gentle slope toward the periphery of the memory cell array when extending the metal layer 46 in the succeeding processing, thereby improving the step coverage. In FIG. 5, although methods for differing the spacings between the bit lines and the widths of the active regions are both performed to improve the step coverage, they may be selectively performed as required.

Figure 6A:
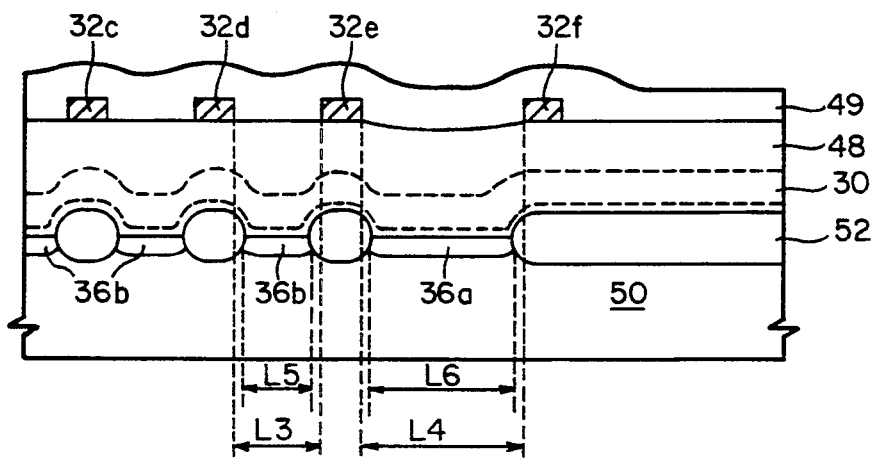
FIGS. 6A to 6C are sectional views showing steps of manufacturing the semiconductor memory device shown in FIG. 5.
Figure 6B:
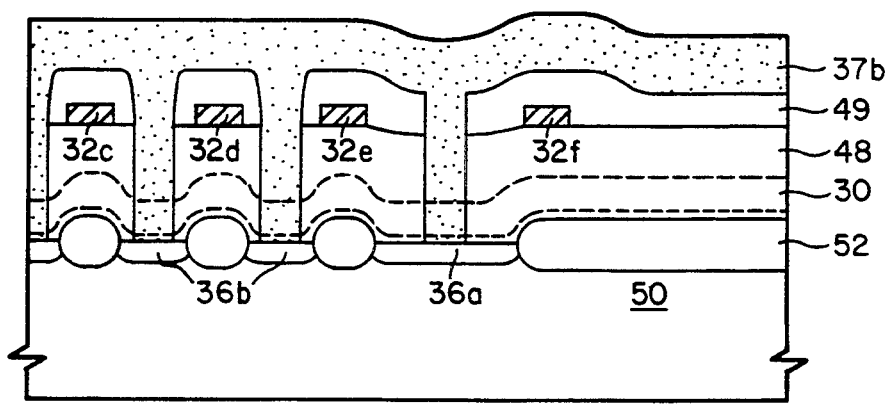
Figure 6C:
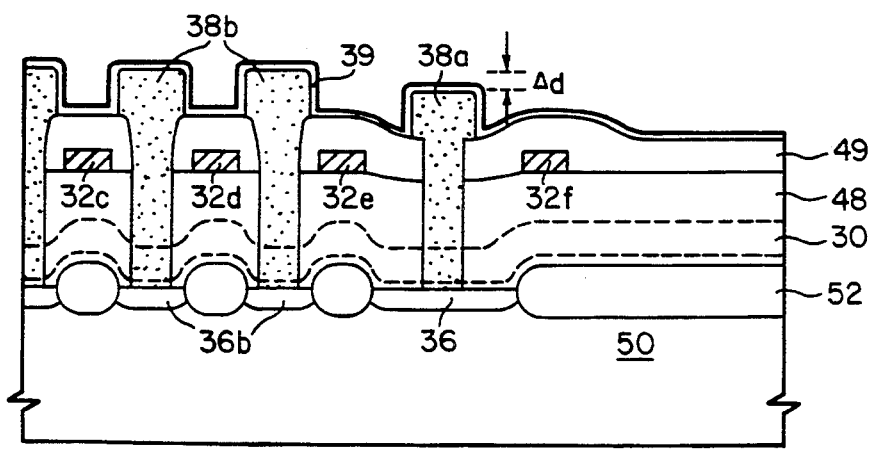

FIGS. 6A to 6C are sectional views showing steps of manufacturing the semiconductor memory device shown in FIG. 5. Referring to FIG. 6A, the field oxide layer 52 for isolating elements is formed on the semiconductor substrate 50 of the first conductivity type by a selective oxidation method, and the word line 30 being apart from the surface of the semiconductor substrate 50 by means of a gate oxide layer formed on the surface of the semiconductor substrate 50 and having an insulating layer to be formed thereon is formed over a predetermined portion of the semiconductor substrate 50 between the field oxide layers 52. Using the insulating layer formed on the upper surface of the word line 30 as a mask for ion-implantation, an impurity of the second conductivity type is ion-implanted to form the active regions 36a and 36b. After this, the first interlayer insulating film 48 is formed over the semiconductor substrate 50, and planarized by the reflow process. The bit lines 32c~32f contacted with predetermined portions of the active regions 36a and 36b are formed over the semiconductor substrate 50. Also, the second interlayer insulating film 49 is formed on the bit lines 32c~32f, and the reflow process is performed. The width $L_6$ of the active region 36a of the outermost memory cell in the memory cell array is formed to be wider than that $L_5$ of the active region 36b of the inner memory cell in the memory cell array. The bit lines 32c~32f are disposed over the field oxide layer 52. The spacing $L_4$ between bit lines 32e and 32f in the periphery of the memory cell array is wider than that $L_3$ between bit lines 32d and 32e in the inner portion of the memory cell array. The first interlayer insulating film 48 is formed as the BPSG layer and planarized by the reflow process. At this time, the surface of the first interlayer insulating film 48 over the active region 36a of the outermost memory cell in the memory cell array is planarized to be lower than that of the first interlayer insulating film 48 over the active region 36b of the inner memory cell in the memory cell array, owing to the step of the word line 30 formed in the lower region thereof. Since the word line 30 is formed in the front or rear portion of the sectioned plane parallel to the sectioned plane of FIG. 6A, it is not shown in the drawing but is denoted by a dotted line.

Referring to FIG. 6B, a predetermined portion of the first and second interlayer insulating film 48 and 49 is etched to expose the surface of the active regions 36a and 36b other than the active regions 36a and 36b contacted with the bit lines 32c~32f, thereby forming a contact hole, and then a polycrystalline silicon layer 37b is formed over the semiconductor substrate 50. The polycrystalline silicon layer 37b is utilized for forming the storage electrode of the capacitor, and is doped with an impurity in a high concentration (e.g., $10^{19}$ion/cm$^3$), to increase conductivity thereof.

Referring to FIG. 6C, using a photomask pattern, the polycrystalline silicon layer 37b is etched to expose predetermined portions of the surface of the second interlayer insulating film 49, thereby forming the storage electrodes 38a and 38b, and then the dielectric film 39 is formed over the semiconductor substrate 50. Here, by the reflow process upon the first and second interlayer insulating films 48 and 49, the surface of the polycrystalline silicon layer 37b over the active region 36b of the inner memory cell in the memory cell array is higher than that of the polycrystalline silicon layer 37b over the active region 36a of the outermost memory cell. Therefore, the storage electrode 38a formed over the active region 36a of the outermost memory cell in the memory cell array has the height difference as much as $\Delta d$ from the height of the storage electrode 38b formed over the active region 36b of the inner memory cell in the memory cell array. Due to the difference $\Delta d$, the metal layer 46 has a gentle slope toward the periphery of the memory cell array when extending the metal layer 46 in the succeeding processing, thereby improving the step coverage. After completing the steps shown in FIG. 6C, the plate electrode 42, third interlayer insulating film 44 and metal layer 46 are sequentially formed on the dielectric film 39, thereby forming the memory cell array shown in FIG. 5. If the third interlayer insulating film 44 is subjected to the planarization process as the first and second interlayer insulating films 48 and 49, the metal layer 46 becomes more gently sloped, thereby further improving the step coverage.

Figure 7:
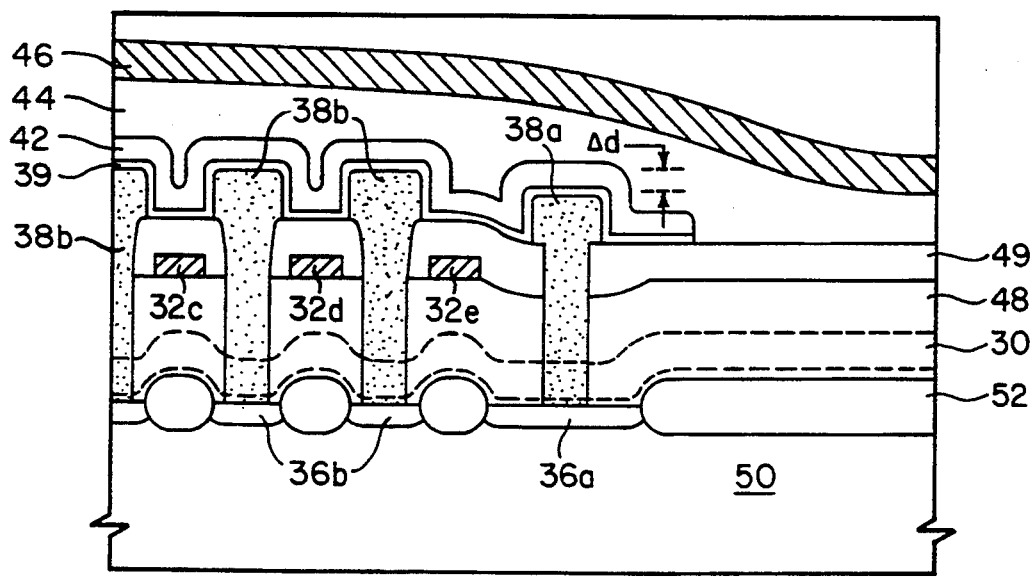
FIG. 7 is a sectional view showing a semiconductor memory device according to a third embodiment of the present invention.

FIG. 7 is a sectional view showing a third embodiment of the present invention taken along line B—B' in FIG. 2. The third embodiment is formed according to the steps for forming the second embodiment, but the outermost bit line 32f among the dummy bit lines in the periphery of the memory cell array shown in FIG. 5 is not formed. Thus, the storage electrode 38a formed over the active region 36a of the outermost memory cell in the memory cell array has the height difference $\Delta d$ from the height of the storage electrode 38b formed over the active region 36b of the inner memory cell. In addition, the outermost dummy bit line 32f shown in FIG. 5 is eliminated to provide a gentle slope between the outermost storage electrode and the periphery of the memory cell array. Therefore, the metal layer 46 having an excellent step coverage is provided during extending the metal layer 46 in the succeeding process.

A fourth embodiment of the present invention is formed according to the steps for forming the second embodiment shown in FIG. 5, except that the length of the outermost storage electrode 38a in the periphery of the memory cell array is longer than that of the storage electrode 38b in the inner portion, and the outermost bit line 32f among the dummy bit lines is not formed, and the width of the active region 36a of the outermost memory cell is wider than that of the active region 36b of the inner memory cell. Therefore, the outermost storage electrode 38a has a gentle slope toward the periphery of the memory cell array to form a predetermined inclination angle with respect to the surface of the semiconductor substrate 50, and the outermost dummy bit line 32f is not formed. Consequently, the step coverage of the metal layer 46 is significantly improved during extending the metal layer 46 in the succeeding process.

According to the present invention as described above, an outermost storage electrode in a memory cell array is formed to have a predetermined inclination angle with respect to the surface of the semiconductor substrate, or the length of the outermost storage electrode is longer than that of a storage electrode in the inner portion, or the spacing between dummy bit lines in the periphery of the memory cell array is longer than that between dummy bit lines in the inner portion, or the width of an active region of the outermost memory cell in the memory cell array is wider than that of an active region of the inner memory cell. As a result, a semiconductor memory device having a metal layer having an excellent step coverage is provided by adjusting the layout arrangement without additional processes while being not concerned about the structure of a storage electrode of a memory cell.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A semiconductor memory device comprising: a plurality of bit lines; a plurality of word lines intersecting said bit lines, and a memory cell array having a plurality of memory cells connected to said bit lines and word lines, each said memory cell being sequentially covered with an insulating layer and a metal layer, and each said memory cell having a switching transistor and a capacitor, said switching transistor having a gate electrode comprising a respective one of said word lines spaced apart from a channel formed between active regions of a second conductivity type formed in a semiconductor substrate of a first conductivity type by means of a gate insulating layer formed on said channel, said capacitor comprising a storage electrode contacted with a respective one of said active regions, said storage electrode of an outermost memory cell in said memory cell array sloping toward a periphery of said memory cell array to form a predetermined inclination angle with respect to said semiconductor substrate, said metal layer extending over said outermost memory cell.

2. A semiconductor memory device as claimed in claim 1, wherein a length of said sloped storage electrode is longer than that of said storage electrode of an inner memory cell in said memory cell array.

3. A semiconductor memory device comprising: a plurality of bit lines; a plurality of word lines intersecting said bit lines, and a memory cell array having a plurality of memory cells connected to said bit lines and word lines, each said memory cell being sequentially covered with an insulating layer and a metal layer, and each said memory cell having a switching transistor and a capacitor, said switching transistor having a gate electrode comprising a respective one of said word lines spaced apart from a channel formed between active regions of a second conductivity type formed in a semiconductor substrate of a first conductivity type by means of a gate insulating layer formed on said channel, said capacitor comprising a storage electrode contacted with a respective one of said active regions, a height of said storage electrode of an outermost memory cell being lower than that of said storage electrode of an inner memory cell in said memory cell array, said metal layer extending over said outermost memory cell.

4. A semiconductor memory device as claimed in claim 3, wherein a width of said active region contacted with said storage electrode of said outermost memory cell is wider than that of said active region contacted with said storage electrode of said inner memory cell.

5. A semiconductor memory device as claimed in claim 4, wherein a spacing between two peripheral bit lines including the outermost bit line is wider than that between bit lines in an inner portion of said memory cell array.

6. A semiconductor memory device comprising: a plurality of bit lines; a plurality of word lines intersecting said bit lines, and a memory cell array having a plurality of memory cells connected to said bit lines and word lines, each said memory cell being sequentially covered with an insulating layer and a metal layer, and each said memory cell having a switching transistor and a capacitor, said switching transistor having a gate electrode comprising a respective one of said word lines spaced apart from a channel formed between active regions of a second conductivity type formed in a semiconductor substrate of a first conductivity type by means of a gate insulating layer formed on said channel, said capacitor comprising a storage electrode contacted with a respective one of said active regions, said storage electrode of an outermost memory cell in said memory cell array sloping toward a periphery of said memory cell array to form a predetermined inclination angle with respect to said semiconductor substrate, a length of said storage electrode of said outermost memory cell being longer than that of said storage electrode of an inner memory cell in said memory cell array, an outermost bit line in said periphery of said memory cell array being formed in the side of said storage electrode of said outermost memory cell and extending toward an inner portion of said memory cell array, said metal layer extending over said outermost memory cell.

* * * * *